United States Patent [19]

Takaki

[11] Patent Number: 5,449,880

[45] Date of Patent: Sep. 12, 1995

[54] PROCESS AND APPARATUS FOR FORMING A DEPOSITED FILM USING MICROWAVE-PLASMA CVD

[75] Inventor: Satoshi Takaki, Yokohama, Japan

[73] Assignee: Canon Kabushiki Kaisha, Tokyo, Japan

[21] Appl. No.: 93,633

[22] Filed: Jul. 20, 1993

[30] Foreign Application Priority Data

Jul. 21, 1992 [JP] Japan .................. 4-194069

[51] Int. Cl.⁶ .................. B23K 10/00; H05B 9/06
[52] U.S. Cl. .................. 219/121.43; 219/121.42; 219/121.47; 219/748; 204/298.02; 204/298.38; 427/575
[58] Field of Search .............. 219/121.43, 748, 121.44, 219/121.47, 76.16, 121.42; 427/575, 569; 315/111.21, 111.41; 204/298.38, 298.16, 298.02

[56] References Cited

U.S. PATENT DOCUMENTS

| | | | |
|---|---|---|---|
| 3,691,338 | 9/1972 | Chang | 219/10.55 |
| 4,187,405 | 2/1980 | Puschner et al. | 219/10.55 A |
| 4,631,380 | 12/1986 | Tran | 219/748 |
| 4,859,493 | 8/1989 | Lemelson | 427/45.1 |
| 5,010,276 | 4/1991 | Echizen et al. | 315/111.21 |
| 5,069,928 | 12/1991 | Echizen et al. | 427/45.1 |
| 5,202,095 | 4/1993 | Houchin et al. | 422/186 |
| 5,296,784 | 3/1994 | Geisler et al. | 315/111.41 |

FOREIGN PATENT DOCUMENTS

60-186849  9/1985  Japan .

Primary Examiner—Mark H. Paschall
Attorney, Agent, or Firm—Fitzpatrick, Cella, Harper & Scinto

[57] ABSTRACT

A process for forming a deposited film on a substrate by microwave plasma CVD comprises holding a substrate in a pressure-reducible reactor vessel, introducing microwave energy into the reactor vessel from at least three microwave-introducing means attached thereto for introducing the microwave energy into the reactor vessel while introducing a raw material gas into the reactor vessel, and forming plasma in the reactor vessel by the microwave energy, thereby forming a deposited film on the surface of the substrate.

16 Claims, 5 Drawing Sheets

PROCESS AND APPARATUS FOR FORMING A DEPOSITED FILM USING MICROWAVE-PLASMA CVD

BACKGROUND OF THE INVENTION

1. Field of the Invention

The present invention relates to a process and an apparatus for forming a deposited film by microwave plasma CVD.

2. Related Background Art

Plasma CVD (chemical vapor deposition) process is a process for bringing a specific substance into a plasma state, thereby converting the specific substance into highly active radicals, and bringing the radicals into contact with a substrate, thereby forming a deposited film on the substrate. The plasma CVD process is based on the high activity of radicals and a desired deposited film can be formed on a substrate by properly selecting a radical density and a temperature of the substrate on which the deposited film is to be formed. One of the important points in the CVD process is efficient radical generation.

Generally, glow discharge has been employed for making plasma from a raw material gas for forming a deposited film, and a high frequency wave of 13.56 MHz has been usually used to generate glow discharge. Recently, high density plasma was efficiently generated with a microwave of 2.45 GHz and thus radicals can be efficiently generated. It has been found that it is possible to heat the substrate at the same time. Thus, the plasma CVD process using a microwave has been regarded as promising, and several processes and apparatuses for forming a deposited film by microwave plasma CVD have been proposed.

For example, various processes and apparatuses for forming insulating deposited films of amorphous silicon, which will be hereinafter referred to as "a-Si", or polycrystalline silicon, will be hereinafter referred to as "p-Si", or $SiO_2$ or SiN or the like as device members for use in semiconductor devices, electrophotographic photosensitive members, image input sensors, pickup devices, photovoltaic elements, or other electronic devices, and optical devices, etc. by microwave plasma CVD have been proposed. One example of the apparatuses for forming a deposited film by microwave plasma CVD is disclosed in JP-A-60-186849. The substrates disclosed by it are so arranged as to surround a microwave energy-introducing zone, thereby forming an internal chamber (that is, a discharge space) and enhancing the utilization efficiency of raw material gas.

Figure 4:
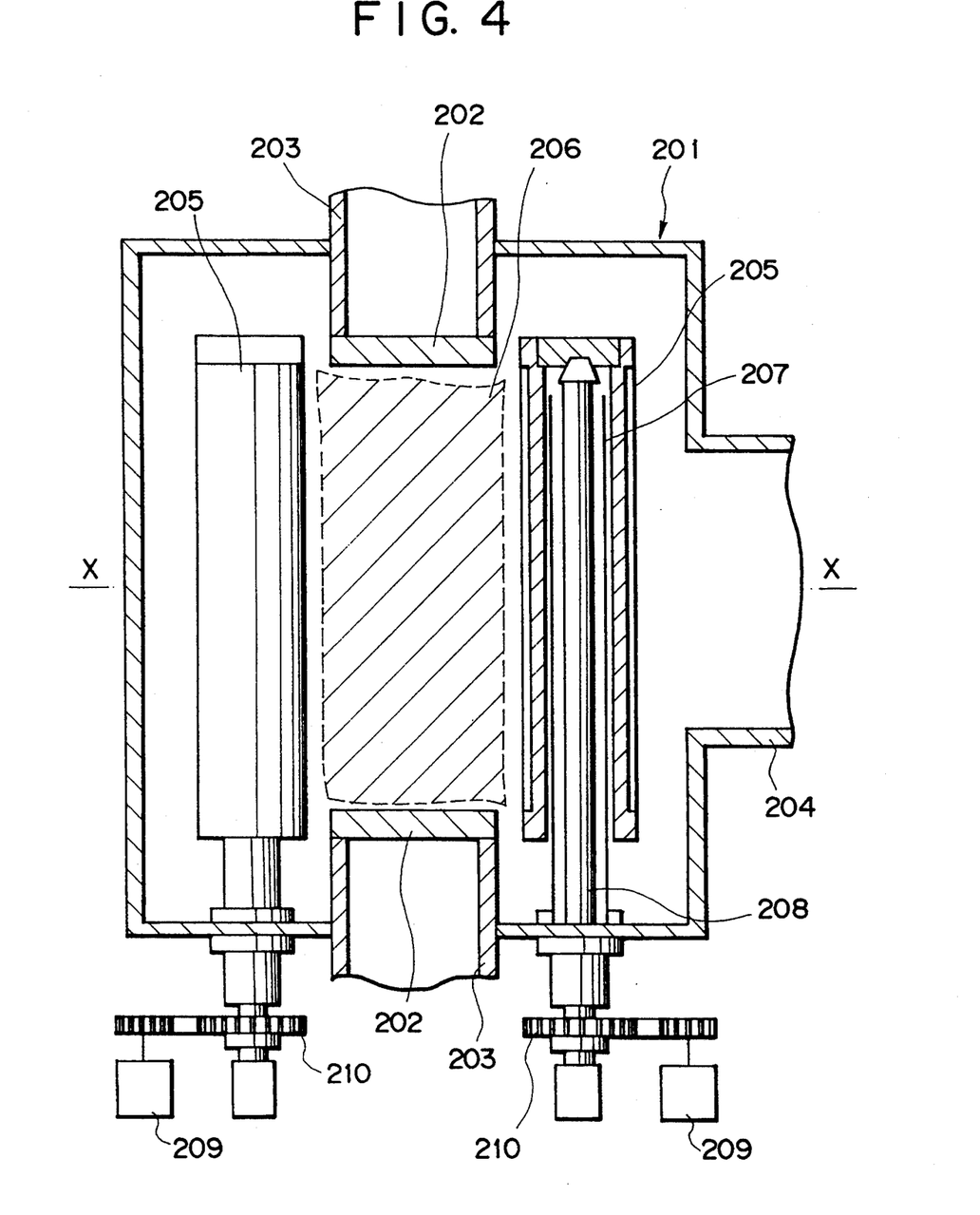
FIG. 4 is a schematic, vertical cross-sectional view showing one example of a conventional apparatus for forming a deposited film.
Figure 5:
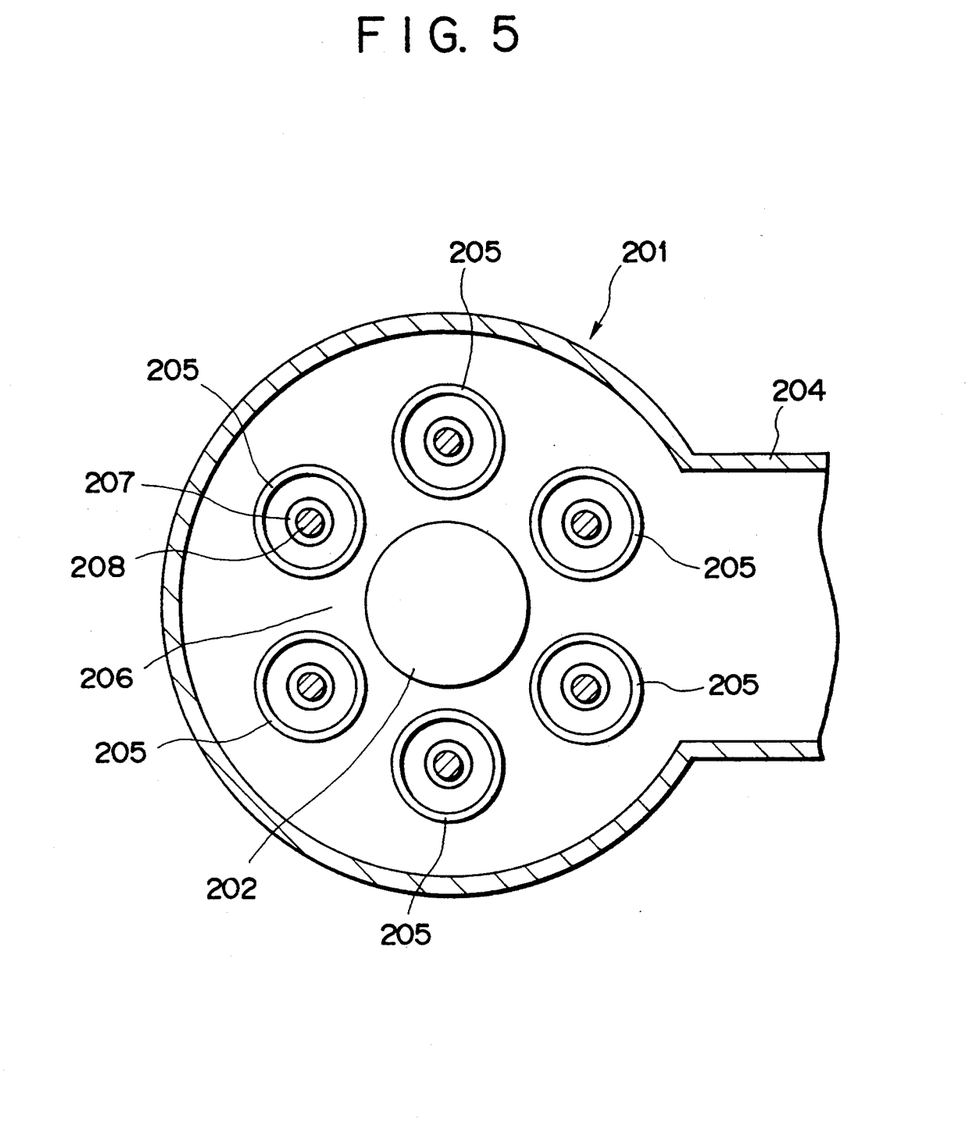
FIG. 5 is a schematic, horizontal cross-sectional view showing the apparatus of FIG. 4 along the line X—X of FIG. 4.

The structure of such a conventional apparatus for forming a deposited film by microwave plasma CVD is shown in FIGS. 4 and 5. The apparatus for forming a deposited film is directed to production of cylindrical electrophotographic photosensitive members. FIG. 4 is schematically a vertical cross-sectional view of the conventional apparatus and FIG. 5 is schematically a horizontal cross-sectional view of the apparatus along line X—X of FIG. 4.

A reactor vessel 201, which can be made vacuum and gas-tight, is a substantially cylindrical vessel. Evacuating pipe 204 formed on the side wall of the vessel, the evacuating pipe 204 is communicated with a vacuum pump (not shown in the drawings). Waveguides 203 are fixed substantially at the centers of the upper and lower sides, respectively, of the reactor vessel 201. The waveguides 203 are connected to a microwave power source (not shown in the drawings) through a stub tuner (not shown in the drawings) or an isolator (not shown in the drawings). Dielectric windows 202 for introducing a microwave are provided at the ends of the waveguides 203, respectively, and the vessel 201 is gas-tightly sealed. The dielectric windows 202 are each made from a material capable of efficiently transmitting microwaves from the waveguides 203 into the reactor vessel 201 and capable of making the inside of the reactor vessel 201 vacuum and gas-tight, for example, quartz glass or alumina ceramics. A plurality of cylindrical substrates 205, on which a deposited film is to be formed, are so arranged in parallel to each other as to surround the center zone of the reactor vessel 201. Each of the substrates 205 is supported by a rotary shaft 208 extended upwardly from the lower side of the reactor vessel 201 and heated by a heater 207 inserted into the substrate 205 and likewise extended upwardly therein from the lower side of the reactor vessel 201. The rotary shaft 208 is rotatable without interrupting the vacuum state of the reactor vessel 201, and the other end of the rotary shaft 208 is connected to a driving motor 209 through a reduction gear 210. Thus, the substrate 205 rotates around its center axis in the longitudinal direction (bus direction) by driving the motor 209.

In the reactor vessel 201, a zone surrounded by the cylindrical substrates 205 and the dielectric windows 202 constitutes a discharge space 206, which is substantially a columnar space whose both ends are confined by each of the dielectric windows 202.

A conventional deposited film formation is carried out in the following manner. At first, the reactor vessel 201 is evacuated by a vacuum pump (not shown in the drawings) through an evacuation pipe 204 to reduce the internal pressure of the reactor vessel 201 to $1 \times 10^{-6}$ Torr or less. Then, all the substrates 205 are heated to a suitable temperature for film deposition by heaters 207. Raw material gases for film formation are introduced into the reactor vessel 201 through raw material gas introducing pipes (not shown in the drawings). In case of forming an a-Si film, raw material gases such as a silane ($SiH_4$) gas, a hydrogen gas, etc. are introduced into the reactor vessel 201. At the same time and in parallel to the introduction of raw material gases, a microwave having a frequency of 500 MHz or more, preferably 2.45 GHz, is generated from a microwave power source (not shown in the drawings) and introduced into the reactor vessel 201 through the waveguides 203 and the dielectric windows 202. As a result, glow discharge is generated in the discharge space 206, and the raw material gases are excited and disassociated by the energy of the microwave to form a deposited film on the surfaces of the cylindrical substrates 205. The substrates 205 are made to rotate by driving the motors 209, and each deposited film can be formed each on the entire peripheral surfaces of substrates 205.

In the case of forming a deposited film by use of the above-mentioned conventional apparatus, when the internal pressure of the reactor vessel is 5 m Torr or less during the film formation, it is possible to obtain a deposited film with practical film thickness and film characteristics uniformly at a high deposition speed, even if a deposited film has a relatively large area, for example, for use of an electrophotographic photosensitive member. However, since only a pair of dielectric windows for introducing the microwave is provided at both ends of the discharge space in the above-mentioned apparatus, the intensity of generated plasma is gradually attenuated as the plasma goes farther from the dielectric windows, when the internal pressure exceeds 5 m Torr during the film formation, and as a result the following problems have been encountered.

Since the intensity of plasma becomes uneven in the discharge space between a pair of the dielectric windows, (1) uneven concentration of radicals formed in the plasma to contribute to the film deposition makes the thickness of a film deposited each on the substrates uneven, (2) uneven distribution of generated radical species makes distribution of deposited film quality uneven, (3) uneven heating of substrates by plasma makes distribution of deposited film quality uneven, and (4) spatially uneven decomposition degree of a doping gas such as diborane ($B_2H_6$) or phosphino ($PH_3$) makes electrical characteristics of a deposited film uneven.

SUMMARY OF THE INVENTION

The present invention has been accomplished in view of the problems described above.

An object of the present invention is to provide a process and an apparatus for stably forming a high quality-functional deposited film, which has uniform film thickness and film characteristics and is applicable as a device member to various electronic devices and optical devices, on a substrate of large area by microwave plasma CVD in good yield.

Another object of the present invention is to provide a process and an apparatus capable of forming a deposited film at a high rate.

DETAILED DESCRIPTION OF THE PREFERRED EMBODIMENTS

According to the present invention, the present process for forming a deposited film on a substrate by microwave plasma CVD, comprises holding a substrate in a pressure-reducible reactor vessel, introducing microwave energy into the reactor vessel from at least three microwave-introducing means attached thereto for introducing the microwave energy into the reactor vessel while introducing a raw material gas into the reactor vessel, and forming plasma in the reactor vessel by the microwave energy, thereby forming a deposited film on the surface of the substrate.

According to the present invention, the present apparatus for forming a deposited film on a substrate held in a reactor vessel by microwave plasma CVD comprises a pressure-reducible reactor vessel, a means for introducing a raw material gas into the reactor vessel, a means for evacuating the reactor vessel, and a means for introducing microwave energy into the reactor vessel, attached to the reactor vessel, wherein the means for introducing microwave energy is provided in the number of three or more.

According to the present invention, a deposited film having practical film characteristics can be formed at a high deposition rate by supplying microwave energy to the discharge space from at least three means for introducing a microwave, whereby a uniform discharge intensity can be maintained throughout the discharge space and also practical film characteristics can be uniformly maintained with a uniform film thickness.

Furthermore, the microwave energy can be efficiently supplied to regions of relatively low discharge intensity in the discharge space, and thus the discharge intensity can be made uniform by minimum microwave energy, and a film having uniform film characteristics and a uniform film thickness can be deposited onto substrates of large area.

As the result of the extensive studies of the present inventor, for the purpose of accomplishing the objects described above, he has established the present invention.

In formation of a deposited film on a substrate of large area such as an electrophotographic photosensitive drum at a high rate by microwave plasma CVD, it is very important to form a deposited film having uniform practical film characteristics and a uniform film thickness. According to the studies made by the present inventor before the establishment of the present invention, he found it very difficult to form a deposited film uniformly having practical film characteristics with a uniform film thickness on a substrate of large area in the above-mentioned, conventional apparatus. That is, when the internal pressure of the reactor vessel is 5 m Torr or less during the film formation, it is possible to form a deposited film uniformly having practical film characteristics with a uniform film thickness even on a substrate of large area such as an electrophotographic photosensitive drum, but it is difficult to stably obtain a deposited film having most suitable film characteristics. On the other hand, when the internal pressure exceeds 5 m Torr during the film formation, a deposited film having most suitable film characteristics can be obtained stably, but uneven distributions of film characteristics appear for the reasons described in the above section "Related Background Art". Furthermore, when the internal pressure exceeds 30 m Torr during the film formation, an uneven distribution of film thickness appears.

As a result of extensive studies, the present inventor has found that, in order to form a deposited film having uniform film characteristics and a uniform film thickness on a substrate of large area under such a condition that practical film characteristics can be obtained, that is, under such a condition that the internal pressure exceeds 5 m Torr during the film formation, additional means for introducing microwave must be provided in addition to a pair of counterposed dielectric windows for introducing microwave as in the prior art. That is, he has found that microwave energy must be introduced from at least three means in total for introducing microwave, thereby making the intensity or density of plasma generated by the microwave energy uniform. For example, a microwave plasma discharge is formed in a space (discharge space) surrounded by at least one member including a substrate and a pair of the counterposed dielectric windows, and a microwave transmission circuit is provided in a position not in direct contact with the discharge space as at least one of other means for introducing a microwave. By providing a microwave transmission circuit in this manner, a film to be properly deposited on the substrates can be prevented as much as possible from deposition onto the microwave transmission circuit. As a result, a film having uniform film characteristics and a uniform film thickness can be deposited onto substrates of large area without any decrease in the deposition rate of the film onto the substrates, while keeping generation of dusts due to peeling of the film deposited on the microwave transmission circuit to a minimum. The microwave introduced from the microwave transmission circuit is propagated through a gas passage provided from the discharge space toward the back sides of the substrates for discharging the reacted gases, and its energy is given to the plasma within the discharge space.

In the present invention, a microwave antenna is preferable as a microwave transmission circuit. More specifically, a leakage antenna using a waveguide such as Lisitano coil, slot antenna, etc., or a coaxial line is preferable. By introducing microwave energy into the discharge space from the microwave antenna, the microwave energy can be efficiently supplied to regions of relatively low discharge intensity in the discharge space, and thus the discharge intensity can be made uniform by minimum! microwave energy, and a film having uniform film characteristics and a uniform film thickness can be deposited onto substrates of large area.

EXAMPLE

Figure 1:
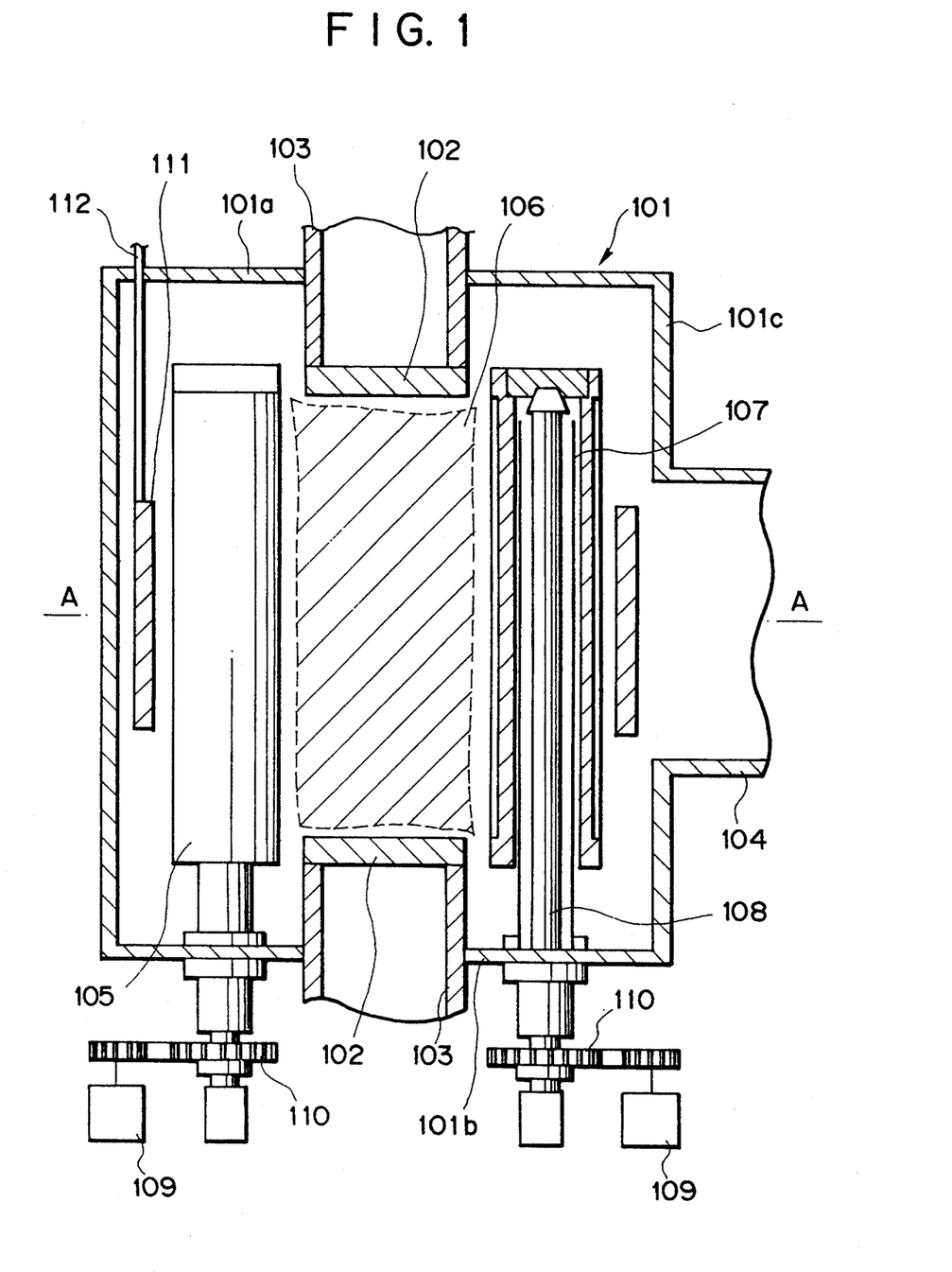
FIG. 1 is a schematic, vertical cross-sectional view showing one example of an apparatus for forming a deposited film according to the present invention.
Figure 2:
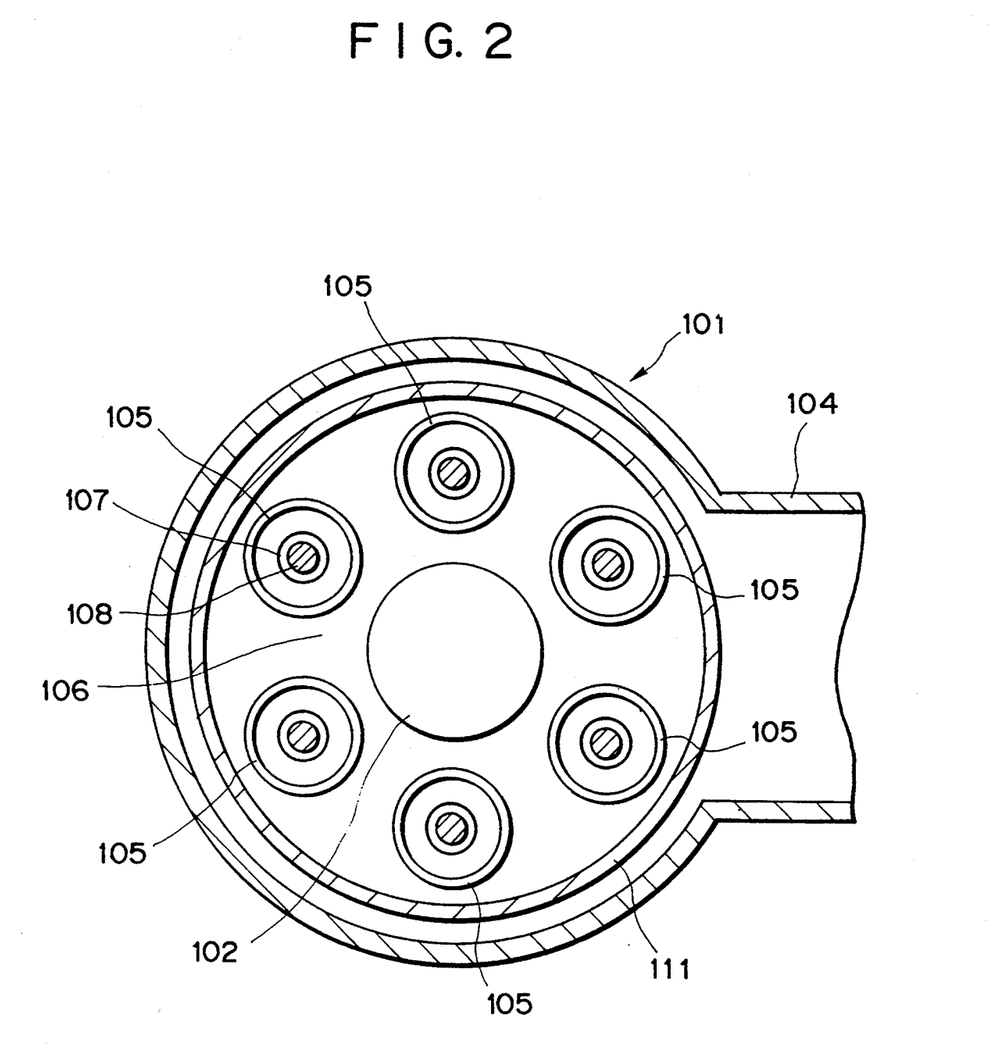
FIG. 2 is a schematic, horizontal cross-sectional view showing the apparatus of FIG. 1 along the line A—A of FIG. 1.

The example of the present invention will be described in detail below, referring to the drawings. FIG. 1 is a schematic, vertical cross-sectional view showing one example of an apparatus for forming a deposit film according to the present invention. FIG. 2 is a schematic, horizontal cross-sectional view of the apparatus of FIG. 1 along the line A—A of FIG. 1.

In FIGS. 1 and 2, a reactor vessel 101, which can be made vacuum and gas-tight, is a substantially cylindrical vessel with an evacuating pipe 104 integrally formed on the side wall 101c, the evacuating pipe 104 being communicated with a vacuum pump (not shown in the drawings), and the reactor vessel 101 can be evacuated to a reduced pressure or vacuum. Cylindrical waveguides 103 are fixed at the centers of disk-like upper side 101a and lower side 101b, respectively, of the reactor vessel 101. The other ends of the waveguides 103 are connected to a microwave power source (not shown in the drawings) through a stub tuner (not shown in the drawings) or an isolator (not shown in the drawings). Dielectric windows 102 for introducing a microwave are gas-tightly sealed at the ends of the respective waveguides on the sides of the reactor vessel 101, that is, at the parts connected to the upper side 101a and the lower part 101b. The dielectric windows 102 are made from a material capable of efficiently transmitting microwaves from the waveguides 103 into the reactor vessel 101 and capable of making the inside of the reactor vessel 101 vacuum and gas-tight, for example, quartz glass or alumina ceramics.

Furthermore, the reactor vessel 101 is provided with raw material gas inlet pipes (not shown in the drawing) for supplying raw material gases into the reactor vessel 101. Other end of the raw material gas pipe is connected to a raw material gas supply source (not shown in the drawing) comprising a combination of gas cylinders and mass flow controllers.

A plurality (6 in this example) of cylindrical substrates 105, on which a deposited film is to be formed, are so arranged in parallel to each other as to surround the center zone of the reactor vessel 101. The center axis of the substrates 105 in the longitudinal direction (bus direction) are in parallel with a straight line connecting one dielectric window 102 to another. Each of the substrates 105 is supported at the upper end parts of the substrate 105 by a rotary shaft 108 extended upwardly from the lower side of the reactor vessel 101 and heated by a heater 107 inserted into the substrate 105 and likewise extended upwardly therein from the lower side of the reactor vessel 101. The rotary shaft 108 is rotatable without interrupting the vacuum state of the reactor vessel 101, and the other end of the rotary shaft 108 is connected to a driving motor 109, through a reduction gear 110. Thus, the substrate 105 rotates around its center axis in the longitudinal direction by driving the motor 109.

Furthermore, a cylindrical microwave antenna 111 is provided along the inside surface of the side wall 101c of the reactor vessel 101 and is connected to one end of a coaxial line 112 for supplying power. The microwave antenna 111 serves to supply microwave energy to the center region in the longitudinal direction of the discharge space 106 described below. Thus, the microwave antenna 112 is provided on the side wall 101c near the center part in the longitudinal direction of the substrates 105. The other end of the coaxial line 112 is connected to a microwave power source (not shown in the drawings) through a matching coil (not shown in the drawings).

Figure 3:
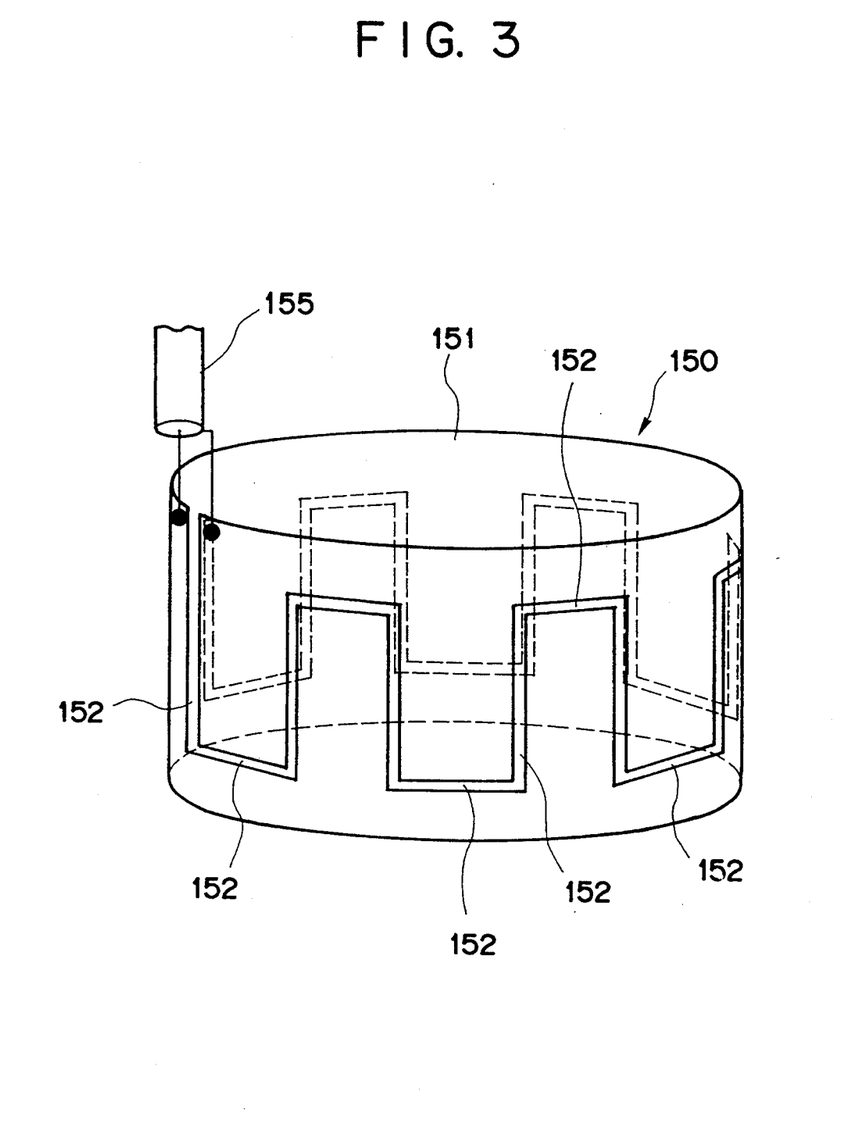
FIG. 3 is a perspective view showing the structure of a microwave antenna.

One specific example of the microwave antenna 111 is a Lisitano coil 150 as shown in FIG. 3. Lisitano coil is a cylindrical metal plate 151, provided with a plurality of slits 152 having a length by multiple integers as large as the half wavelength ($\lambda/2$) of microwave, the slits 152 being connected to one another to form one continued line. By supplying a microwave through power supply coaxial lines 155 connected to both side parts of the initial slit 152 in the one continued line, the microwave is propagated along the circumferential direction of the metal plate 151, while successively emitting the microwave along the one continued line of slits 152. In this Example, the microwave antenna 111 is not limited to the Lisitano coil, and a slot antenna, etc. can be used.

In the reactor vessel 101, a zone surrounded by the cylindrical substrates 105 and each of dielectric windows 102 constitutes a discharge space 106, which is a columnar space whose both ends are confined by each of the dielectric windows 102.

A deposited film can be formed by the above-mentioned apparatus in the following manner. At first, the reactor chamber 101 is evacuated by a vacuum pump (not shown in the drawings) through an evacuation pipe 104 to reduce the interval pressure of the reactor vessel 101 to $1 \times 10^{-6}$ Torr or less. Then, all the substrates 105 are heated to a suitable temperature for film deposition by heaters 107. In case of forming an a-Si film, raw material gases such as a silane ($SiH_4$) gas, a hydrogen gas, etc. are introduced into the reactor vessel 101 through raw material inlet pipes (not shown in the drawings). At the same time and in parallel to the introduction of raw material gases, a microwave having a frequency of 500 MHz or more, preferably 2.45 GHz, is generated from a microwave power source (not shown in the drawing) and introduced into the reactor vessel 101 through the waveguides 103 and the dielectric windows 102. Then, microwave energy is supplied to the microwave antenna 111 through the coaxial line 112 from the microwave power source (not shown in the drawing). At that time, the intensity of the microwave to be supplied to the microwave antenna 111 is appropriately adjusted to make the discharge intensity uniform in the discharge space 106. As a result, glow discharge is generated in the discharge space 106, and the raw material gases are excited and dissociated by the energy of the microwave to form a deposited film on the surfaces of the cylindrical substrates 105. The substrates are made to rotate by driving the motors 109, and a deposited film can be formed each on the entire peripheral surfaces of substrates 105.

In the present invention, a microwave energy can be supplied from the microwave antenna 111 to the region where the discharge intensity is lower only by the microwave energy from the dielectric windows 102, that is, the center region in the longitudinal direction of the columnar discharge space 106, and thus the discharge intensity can be made uniform throughout the discharge space, and a deposited film having practical film characteristics can be formed one the substrates 105, while maintaining uniform film characteristics and a uniform film thickness.

Characteristics of the deposited films formed on the substrates 105, using the above-mentioned apparatus described above were determined while changing the level of microwave energy to be supplied to the microwave antenna 111. The results will be explainend below. The deposited film of three-layer structure was formed on aluminum cylindors, 108 mm in diameter, 358 mm long and 5 mm in wall thickness, as substrates 105 in film-forming conditions shown in the following Table 1, where sum total of microwave energy (total microwave power) introduced into the reactor vessel 101 from the dielectric windows 102 and the microwave antenna was made constant. Fluctuations in the electric characteristics and film thickness of the thus formed deposited films (samples) were determined as distribution of film characteristics and distribution of film thickness, respectively, where fluctuations in the electric characteristics were determined by measuring fluctuation of dark potential when the samples were electrically charged. The results are shown in the following Table 2.

As is apparent from the foregoing results, the fluctuations in the electric characteristics and film thickness could be improved to a level substantially free of practical problems by supplying microwave energy into the discharge space 106 also from the microwave antenna 111 provided at a position not in direct contact with the discharge space 106, as compared with no supply therefrom, even though the internal pressure was as high as 20 m Torr during the film formation.

As described above, according to the present invention, a deposited film having film characteristics of high quality can be formed at a high deposition rate by supplying microwave energy to the discharge space from at least three means for introducing a microwave, whereby a uniform discharge intensity can be maintained throughout the discharge space and also film characteristics can be uniformly maintained with a uniform film thickness.

TABLE 1

|  | 1st layer | 2nd layer | 3rd layer |
|---|---|---|---|
| Raw material gas flow rates |  |  |  |

TABLE 1-continued

|  | 1st layer | 2nd layer | 3rd layer |
|---|---|---|---|
| (sccm) |  |  |  |
| $SiH_4$ | 500 | 500 | 100 |
| $H_2$ | 200 | 200 | 200 |
| $B_2H_6$ (concentration based on $SiH_4$; ppm) | 1000 | 0 | 0 |
| $CH_4$ | 0 | 0 | 500 |
| He | 3000 | 3000 | 3000 |
| Internal pressure (mTorr) | 20 | 20 | 20 |
| Substrate temperature (°C.) | 250 | 250 | 250 |
| Total microwave power (W) | 1400 | 1400 | 1400 |
| Standard film thickness (μm) | 3 | 20 | 0.5 |
| Microwave power from microwave antenna 111 (W) | 0, 100, 200, 300 | | |

TABLE 2

| Microwave power from microwave antenna 111 (W) | 0 | 100 | 200 | 300 |
|---|---|---|---|---|
| Film characteristic distribution (%) | 12.2 | 5.1 | 2.6 | 3.0 |
| Film thickness distribution (%) | 4.7 | 2.8 | 2.6 | 2.7 |

What is claimed is:

1. A process for forming a deposited film on a substrate by microwave plasma CVD, which comprises:
   holding a substrate in a pressure-reducible reactor vessel,
   introducing microwave energy into the reactor vessel from a pair of counterposed microwave-introducing means attached thereto for introducing the microwave energy into the reactor vessel while introducing a raw material gas into the reactor vessel,
   introducing microwave energy from at least one microwave introducing means other than said pair of counterposed microwave-introducing means into the microwave introduction space formed by said pair of counterposed microwave introducing means, and
   forming plasma in the reactor vessel by the microwave energy, thereby forming a deposited film on the surface of the substrate.

2. A process according to claim 1, wherein a microwave transmission circuit formed by at least one of the microwave introducing means other than said pair of counterposed microwave-introducing means provided at a position not in direct contact with a discharge space is a microwave antenna.

3. A process according to claim 1, wherein the substrate is in a cylindrical form.

4. The process according to claim 1, wherein the at least one other microwave-introducing means is provided so as to be in opposition to a discharge space via a member.

5. The process according to claim 4, wherein the member is the substrate.

6. The process according to claim 2, wherein the microwave antenna is a Lisitano coil.

7. The process according to claim 2, wherein the microwave antenna is a slot antenna.

8. The process according to claim 1, wherein the microwave energy is introduced from a microwave introducing window of the pair of counterposed microwave introducing means.

9. An apparatus for forming a deposited film on a substrate held in a reactor vessel by microwave plasma CVD, which comprises:
- a pressure-reducible reactor vessel,
- a means for introducing a raw material gas into the reactor vessel,
- a means for evacuating the reactor vessel, and
- a means for introducing microwave energy into the reactor vessel, attached to the reactor vessel,
- wherein the means for introducing microwave energy comprises a pair of counterposed microwave introducing means and at least one microwave-introducing means other than said pair of counterposed microwave introducing means for introducing microwave energy into a microwave introduction space formed by said pair of counterposed microwave introducing means.

10. An apparatus according to claim 9, wherein a microwave transmission circuit formed by at least one of the microwave-introducing means provided at a position not in direct contact with a discharge space is a microwave antenna.

11. An apparatus according to claim 9, wherein the substrate is in a cylindrical form.

12. The apparatus according to claim 9, wherein the at least one other microwave-introducing means is provided so as to be in opposition to a discharge space via a member.

13. The apparatus according to claim 12, wherein the member is the substrate.

14. The apparatus according to claim 10, wherein the microwave antenna is a Lisitano coil.

15. The apparatus according to claim 10, wherein the microwave antenna is a slot antenna.

16. The apparatus according to claim 9, wherein the pair of the counterposed microwave-introducing means each has a microwave-introducing means each has a microwave-introducing window.

* * * * *

UNITED STATES PATENT AND TRADEMARK OFFICE
CERTIFICATE OF CORRECTION

PATENT NO.   : 5,449,880
DATED        : September 12, 1995
INVENTOR(S)  : SATOSHI TAKAKI It is certified that error appears in the above-identified patent and that said Letters Patent is hereby corrected as shown below:

COLUMN 2

Line 43, "into-the" should read --into the--.
Line 55, "each" (second occurrence) should be deleted.

COLUMN 5

Line 27, "minimum!" should read --minimum--.
Line 35, "deposit" should read --deposited--.

COLUMN 6

Line 27, "antenna 112" should read --antenna 111--.
Line 56, "interval" should read --internal--.

COLUMN 7

Line 9, "dissociated" should read --disassociated--.
Line 23, "one" should read -on--.

UNITED STATES PATENT AND TRADEMARK OFFICE
CERTIFICATE OF CORRECTION

PATENT NO. : 5,449,880
DATED : September 12, 1995
INVENTOR(S) : SATOSHI TAKAKI

It is certified that error appears in the above-identified patent and that said Letters Patent is hereby corrected as shown below:

COLUMN 10

Line 18, "each" (second occurrence) should read --and each--.

Signed and Sealed this

Fifth Day of March, 1996

Attest:

BRUCE LEHMAN

*Attesting Officer*    *Commissioner of Patents and Trademarks*